(12) United States Patent
Takagi et al.

(10) Patent No.: US 9,497,873 B2
(45) Date of Patent: Nov. 15, 2016

(54) POWER MODULE INCLUDING FIRST AND SECOND SEALING RESINS

(71) Applicant: Hitachi Automotive Systems, Ltd., Hitachinaka-shi, Ibaraki (JP)

(72) Inventors: Yusuke Takagi, Hitachinaka (JP); Akira Matsushita, Hitachinaka (JP); Hideto Yoshinari, Hitachinaka (JP); Nobutake Tsuyuno, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 12 days.

(21) Appl. No.: 14/419,013

(22) PCT Filed: Jul. 10, 2013

(86) PCT No.: PCT/JP2013/068806
§ 371 (c)(1),
(2) Date: Feb. 2, 2015

(87) PCT Pub. No.: WO2014/024622
PCT Pub. Date: Feb. 13, 2014

(65) Prior Publication Data
US 2015/0245523 A1    Aug. 27, 2015

(30) Foreign Application Priority Data

Aug. 9, 2012    (JP) .................................. 2012-177259

(51) Int. Cl.
*H05K 5/06*    (2006.01)
*H05K 7/20*    (2006.01)
(Continued)

(52) U.S. Cl.
CPC ............. *H05K 5/062* (2013.01); *H01L 23/051* (2013.01); *H01L 23/24* (2013.01); *H01L 23/42* (2013.01);
(Continued)

(58) Field of Classification Search
CPC ............ H05K 5/0602; H05K 7/20409; H01L 23/051; H01L 23/24; H01L 23/42; H01L 23/3135; H01L 23/3142; H01L 23/4334; H01L 23/49562; H01L 25/07; H01L 25/18; H01L 24/73; H01L 2224/32245; H01L 2224/33181; H01L 2224/48247; H01L 2224/73265; H01L 2924/1305; H01L 2924/13055; H01L 2924/13091; H01L 2924/181; H02M 7/003
See application file for complete search history.

(56) References Cited

U.S. PATENT DOCUMENTS 5,367,196 A * 11/1994 Mahulikar ............ H01L 23/315
257/675
5,558,735 A *  9/1996 Rettew ...................... B32B 7/12
156/275.5

(Continued)

FOREIGN PATENT DOCUMENTS

JP    2010-110143 A    5/2010
JP    2010-258315 A    11/2010
(Continued)

OTHER PUBLICATIONS

International Search Report (PCT/ISA/210) dated Oct. 8, 2013, with English translation (two (2) pages).

*Primary Examiner* — Zachary M Pape
(74) *Attorney, Agent, or Firm* — Crowell & Moring LLP

(57) ABSTRACT

Sealing force between a metal case and a power semiconductor module is improved. In a power semiconductor module 3, peripheral side surfaces of power semiconductor devices 31U and 31L and conductor plates 33 to 36 are integrated by being covered with a first sealing resin 6. An oxide layer (rough surface layer) 46 is formed on an inner surface of a metal case 40. A fluid resin material is injected into a space S between the oxide layer 46 provided to the metal case 40 and a power semiconductor module 30, and then a second sealing resin 52 is formed. The second sealing resin 52 fills dents of the oxide layer 46, and therefore sealing force improves.

10 Claims, 17 Drawing Sheets

(51) Int. Cl.
  *H01L 23/42*      (2006.01)
  *H01L 23/051*     (2006.01)
  *H01L 23/24*      (2006.01)
  *H02M 7/00*       (2006.01)
  *H01L 25/07*      (2006.01)
  *H01L 25/18*      (2006.01)
  *H01L 23/433*     (2006.01)
  *H01L 23/495*     (2006.01)
  *H01L 23/31*      (2006.01)
  *H01L 23/00*      (2006.01)

(52) U.S. Cl.
  CPC ............... *H01L 25/07* (2013.01); *H01L 25/18* (2013.01); *H02M 7/003* (2013.01); *H05K 7/20409* (2013.01); *H01L 23/3135* (2013.01); *H01L 23/3142* (2013.01); *H01L 23/4334* (2013.01); *H01L 23/49562* (2013.01); *H01L 24/73* (2013.01); *H01L 2224/32245* (2013.01); *H01L 2224/33181* (2013.01); *H01L 2224/48247* (2013.01); *H01L 2224/73265* (2013.01); *H01L 2924/1305* (2013.01); *H01L 2924/13055* (2013.01); *H01L 2924/13091* (2013.01); *H01L 2924/181* (2013.01); *H05K 7/20418* (2013.01)

(56) References Cited

U.S. PATENT DOCUMENTS

| | | | |
|---|---|---|---|
| 7,105,384 B2* | 9/2006 | Usui | H01L 21/4832 257/E23.124 |
| 7,183,589 B2* | 2/2007 | Kameyama | H01L 24/03 257/100 |
| 7,329,957 B2* | 2/2008 | Sakano | H01L 21/4832 257/708 |
| 7,915,090 B2* | 3/2011 | Takahashi | H01L 21/561 257/E21.502 |
| 8,952,525 B2* | 2/2015 | Ide | H01L 23/36 257/706 |
| 9,000,553 B2* | 4/2015 | Tokuyama | H01L 25/072 257/499 |
| 9,042,147 B2* | 5/2015 | Ishii | H02M 1/12 361/677 |
| 9,306,020 B2* | 4/2016 | Fujino | H01L 23/36 |
| 2010/0059782 A1* | 3/2010 | Fujitomo | H01L 24/97 257/98 |
| 2011/0299265 A1* | 12/2011 | Nakatsu | B60L 11/14 361/820 |
| 2011/0310585 A1* | 12/2011 | Suwa | H05K 7/2089 361/820 |
| 2012/0087095 A1* | 4/2012 | Tokuyama | B60K 6/445 361/721 |
| 2012/0300522 A1* | 11/2012 | Tokuyama | H01L 25/072 363/131 |
| 2013/0062751 A1* | 3/2013 | Takagi | H01L 23/3675 257/692 |
| 2013/0088279 A1* | 4/2013 | Shimano | H03K 17/163 327/401 |
| 2013/0094269 A1* | 4/2013 | Maeda | H02M 7/003 363/141 |
| 2013/0119525 A1* | 5/2013 | Tsuyuno | B60L 1/003 257/675 |
| 2013/0153428 A1* | 6/2013 | Akana | C25D 11/20 205/50 |
| 2013/0175678 A1* | 7/2013 | Ide | H01L 23/36 257/675 |
| 2013/0279230 A1* | 10/2013 | Suwa | H01L 23/4334 363/141 |
| 2014/0110752 A1* | 4/2014 | Fujino | H01L 25/18 257/133 |
| 2014/0168901 A1* | 6/2014 | Ide | H01L 23/36 361/717 |
| 2014/0292143 A1* | 10/2014 | Ichikawa | H03H 9/0509 310/311 |
| 2015/0003019 A1* | 1/2015 | Ide | H05K 1/0271 361/705 |
| 2015/0016063 A1* | 1/2015 | Higuma | H02M 7/003 361/714 |
| 2015/0245523 A1* | 8/2015 | Takagi | H02M 7/003 361/715 |

FOREIGN PATENT DOCUMENTS

| | | | | |
|---|---|---|---|---|
| JP | 2010258315 A | * | 11/2010 | |
| JP | 2011216754 A | * | 10/2011 | |
| JP | 2011233606 A | * | 11/2011 | |
| JP | WO 2012002454 A1 | * | 1/2012 | ............ H01L 21/50 |
| JP | 2012-138409 A | | 7/2012 | |
| JP | 2012138409 A | * | 7/2012 | |

* cited by examiner

POWER MODULE INCLUDING FIRST AND SECOND SEALING RESINS

TECHNICAL FIELD

The present invention relates to a power module in which a power semiconductor module is stored in a metal case.

BACKGROUND ART

A power converter for driving a motor is mounted on a hybrid car and an electric car.

The power converter drives the motor by converting DC power supplied from a battery into AC power, and also converts AC power regenerated by the motor into DC power and stores the DC power in a power storage apparatus.

The power converter includes a power module in which a power semiconductor module including a semiconductor device is stored in a metal case. The power semiconductor module includes the semiconductor device and a radiation conductor plate supporting the semiconductor device, and has a structure in which the semiconductor device and the conductor plate are integrated by covering, with a resin material, peripheral side surfaces of the semiconductor device and the conductor plate. The metal case stores the power semiconductor module in close contract with the conductor plate.

As such a structure, a structure is known in which an adhesive insulating layer is formed between an inner surface of the metal case and an outer surface of the conductor plate of the power semiconductor module for improving insulation performance and heat conductivity (see PTL 1, for example).

CITATION LIST

Patent Literature

PTL 1: JP 2010-110143 A

SUMMARY OF INVENTION

Technical Problem

In the above power module, moisture may adhere between the inner surface of the metal case and the outer surface of the power semiconductor module.

Solution to Problem

A power module according to the present invention is used in a power converter and mutually converts DC and AC. The power module includes: a power semiconductor module including a pair of conductor plates, a semiconductor device disposed between the conductor plates, and a first sealing resin covering side surfaces of the pair of conductor plates, the power semiconductor module being integrated by the first sealing resin; a metal case including a heat dissipation unit on an outer side surface thereof and a storage unit storing the power semiconductor module; and a second sealing resin provided on an outer peripheral side of the first sealing resin of the power semiconductor module stored in the metal case, a side surface of the second sealing resin adhering to an inner surface of the metal case. The power module includes a rough surface layer, for improving adhesiveness with the second sealing resin, at least on a region opposing the side surface of the second sealing resin on the inner surface of the metal case, and the second sealing resin fills dents of the rough surface layer.

Advantageous Effects of Invention

According to the present invention, sealing force can be improved because a second sealing resin adheres to a rough surface layer on an inner surface of a metal case by infiltrating therein.

DESCRIPTION OF EMBODIMENTS

An embodiment of a power module according to the present invention will be described below with reference to the accompanying drawings.

First Embodiment

[Overall Structure of Power Module]

Figure 1:
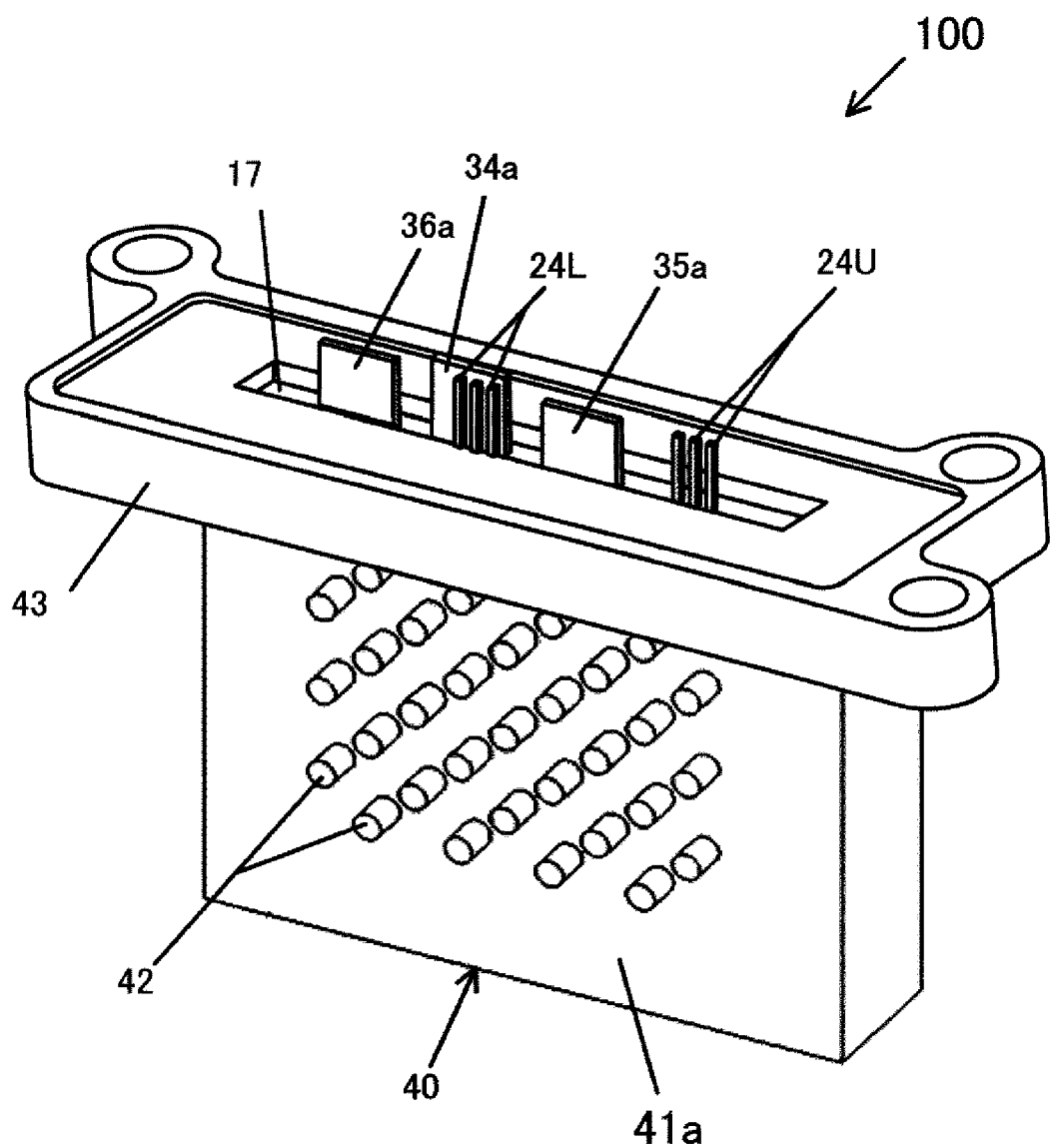
FIG. 1 is an appearance perspective view as an embodiment of a power module according to the present invention.
Figure 2:
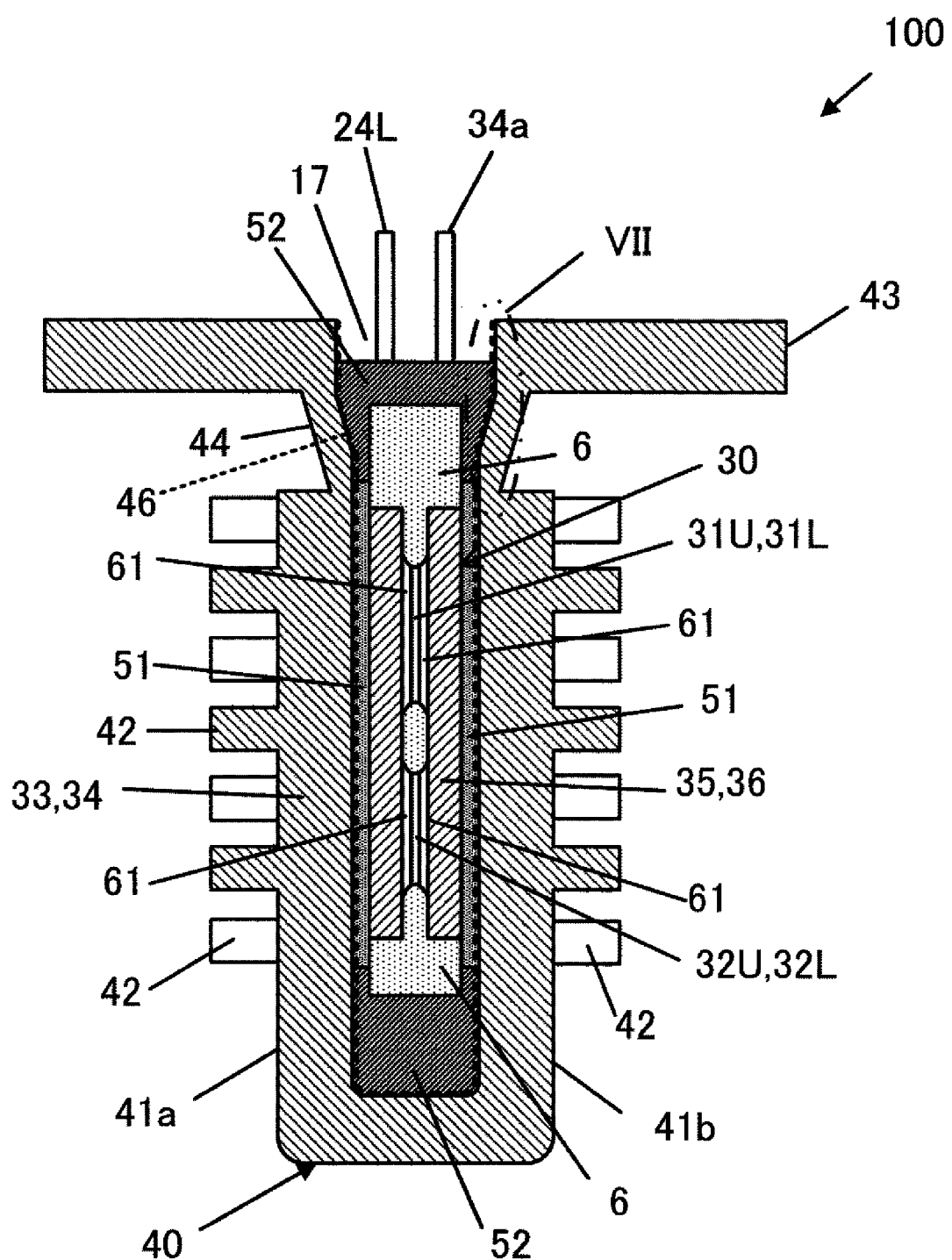
FIG. 2 is a longitudinal sectional view of FIG. 1.

FIG. 1 is an appearance perspective view illustrating an embodiment of a power module according to the present invention. FIG. 2 is a longitudinal sectional view of the power module illustrated in FIG. 1.

In a power module 100, a power semiconductor module 30 (see FIGS. 3 and 4), which includes a switching device and has been subjected to transfer molding, is stored in a metal case 40 which is a CAN cooler. The power module 100 is, for example, used for a power converter mounted on an electric vehicle such as an electric car and a hybrid car.

Herein, a CAN type cooler means a cylindrical cooler including an insertion opening 17 on one surface and a bottom on another surface. The metal case 40 is formed of an electrical conductive member such as Cu, Cu alloy, a compound material such as Cu—C and Cu—CuO, Al, Al alloy, or a compound material such as AlSiC and Al—C. Also, the metal case 40 is integrally molded like a case in a seamless manner by a joining method capable of improving water proofing performance such as welding, or by forging or casting.

The metal case 40 is a flat case which does not have an opening other than the insertion opening 17 provided on one side. The insertion opening 17 of the flat case has a flange 43. A heat dissipation unit 41a is provided on one of two opposing wide surfaces of the flat case, and a heat dissipation unit 41b (see FIG. 2) is provided on the other surface. The heat dissipation unit 41a and the heat dissipation unit 41b function as heat dissipation walls of the metal case 40, and multiple heat dissipation fins 42 are arranged in a matrix on outer side surfaces thereof. Surfaces surrounding the heat dissipation unit 41a and the heat dissipation unit 41b are a thin wall portion 44 having a small thickness and easily capable of plastic deformation. By reducing the thickness of the thin wall portion 44, the heat dissipation unit 41a and the heat dissipation unit 41b can easily deform when pressure is applied in a direction toward the inside of the case, in a process for manufacturing the power module 100. A form of the metal case 40 is not necessarily an exact rectangular parallelepiped, and a corner may be curved.

The power semiconductor module 30 (see FIGS. 3 and 4), which is a first sealed body, is stored in the metal case 40.

[Power Semiconductor Module]

Figure 3:
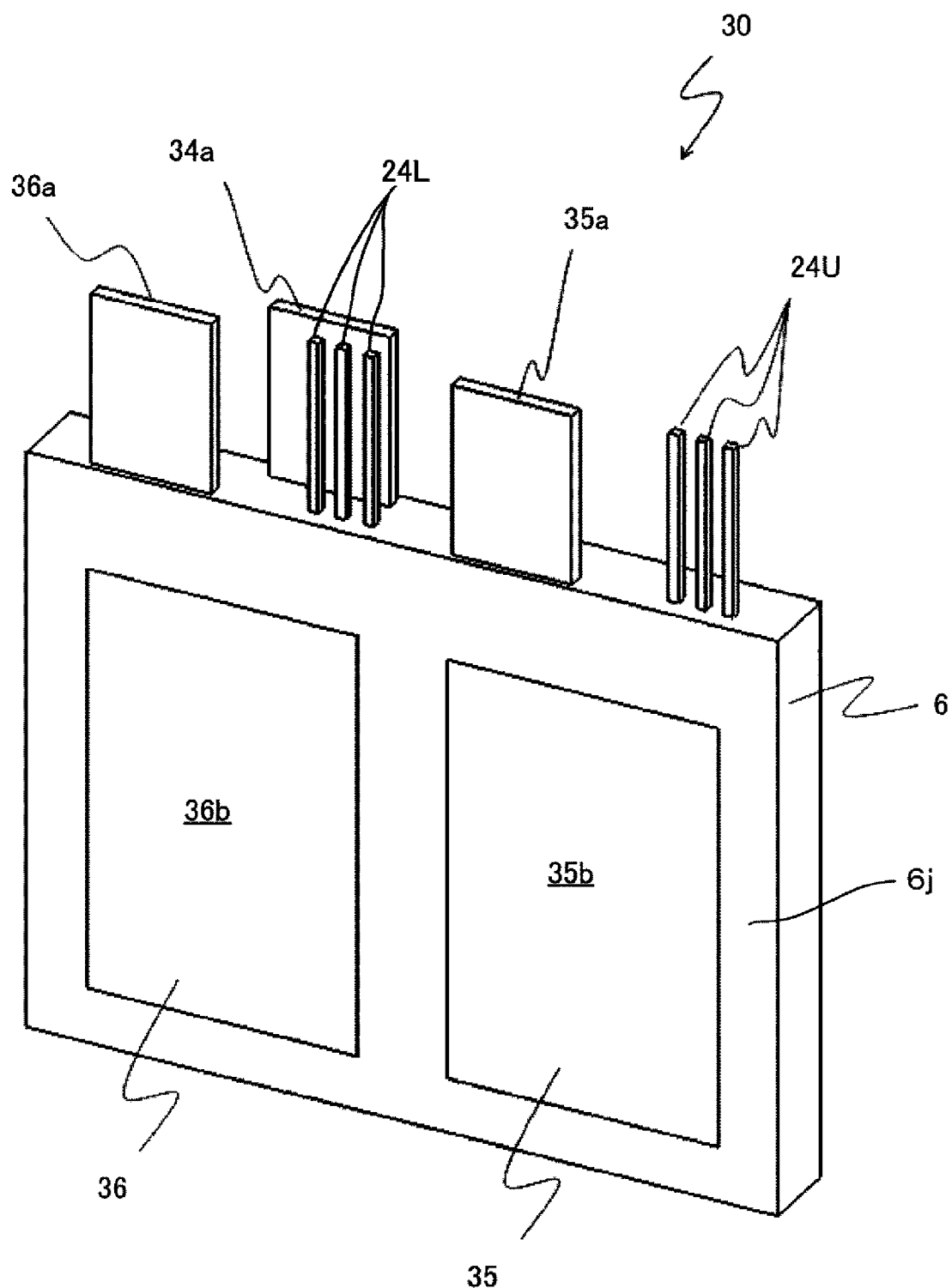
FIG. 3 is an appearance perspective view of a front surface side of a power semiconductor module.
Figure 4:
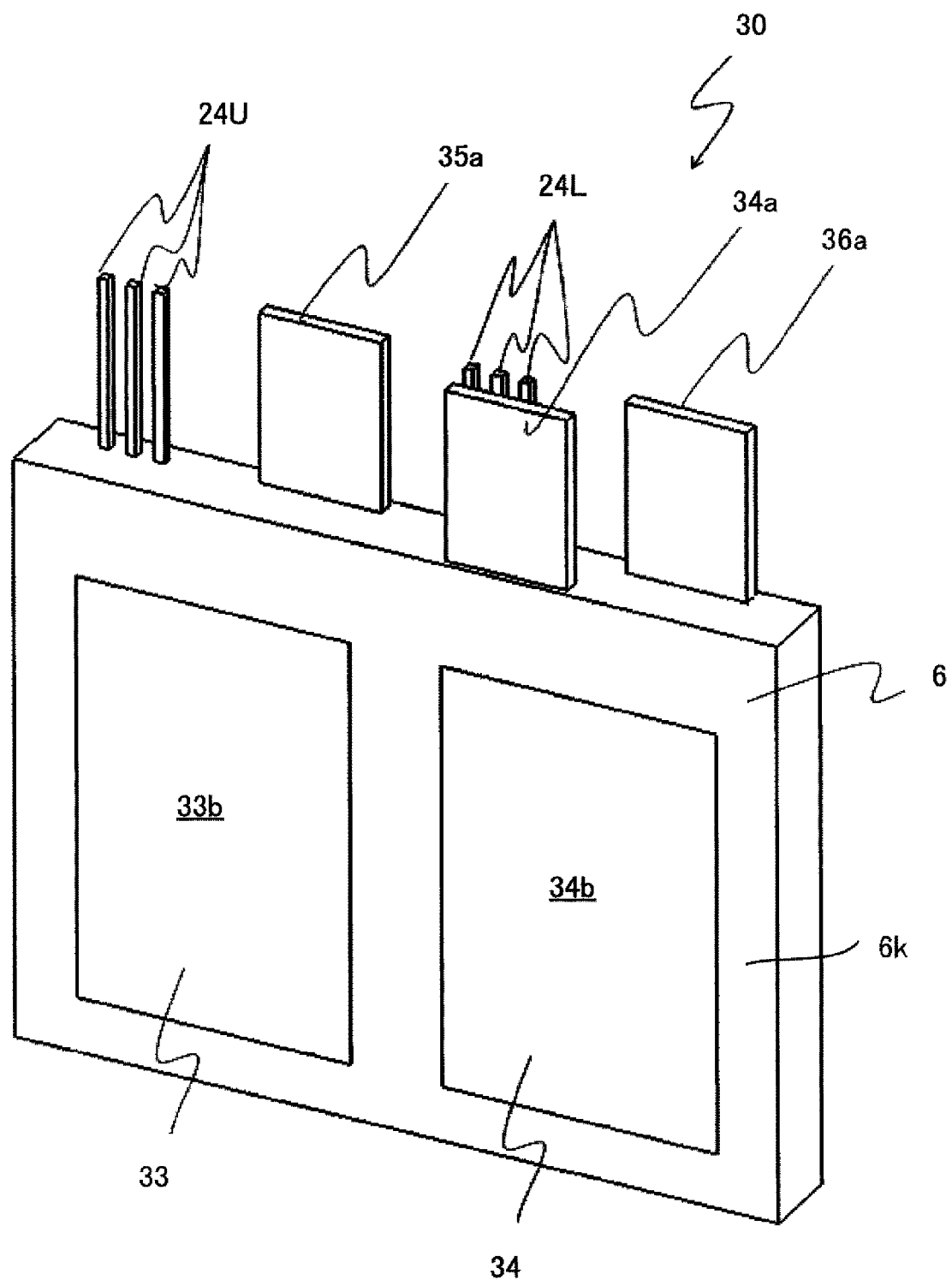
FIG. 4 is an appearance perspective view of a back surface side of the power semiconductor module.
Figure 5:
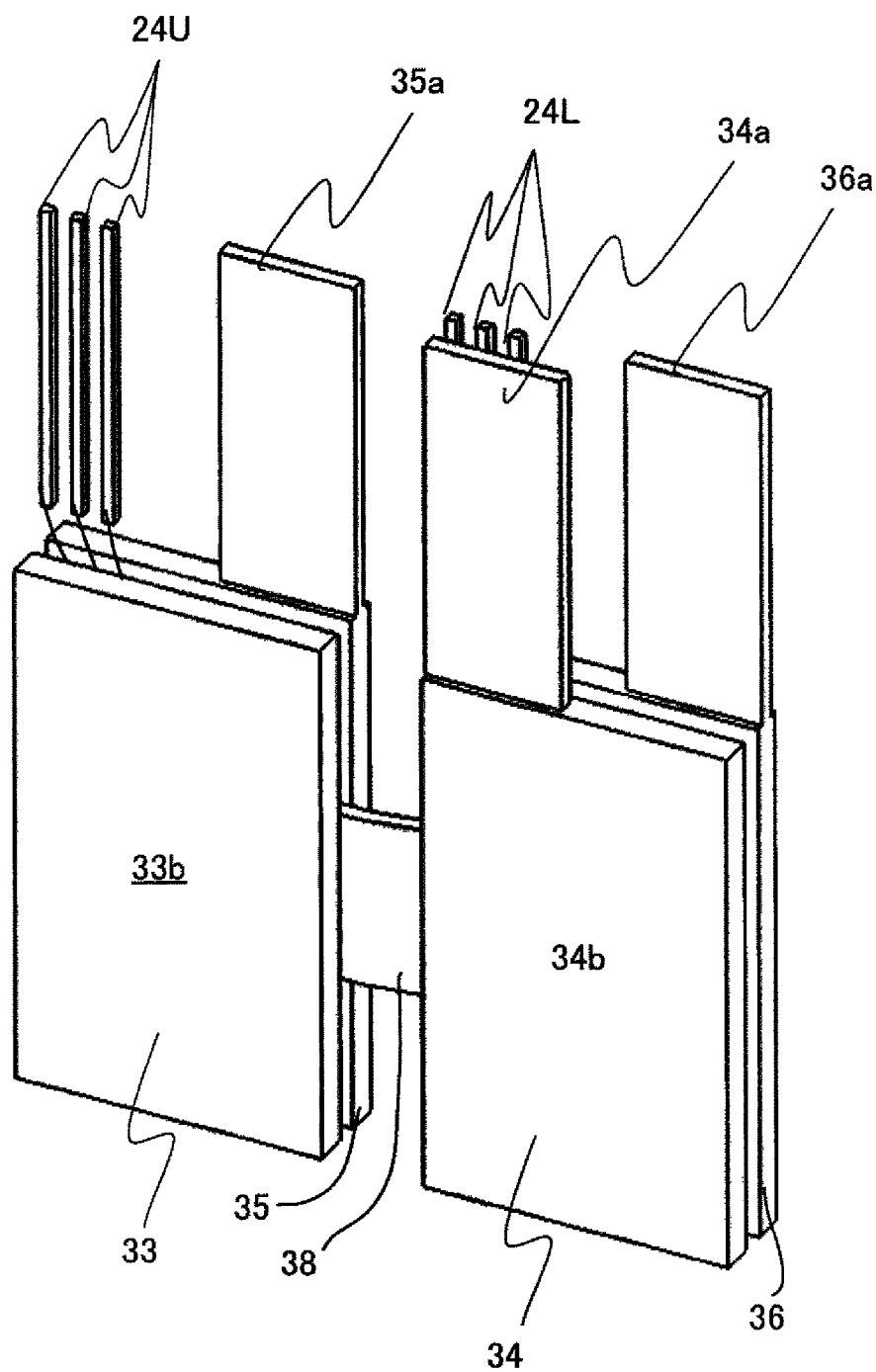
FIG. 5 is a perspective view of the power semiconductor module, from which a first sealing resin illustrated in FIG. 4 is removed.
Figure 6:
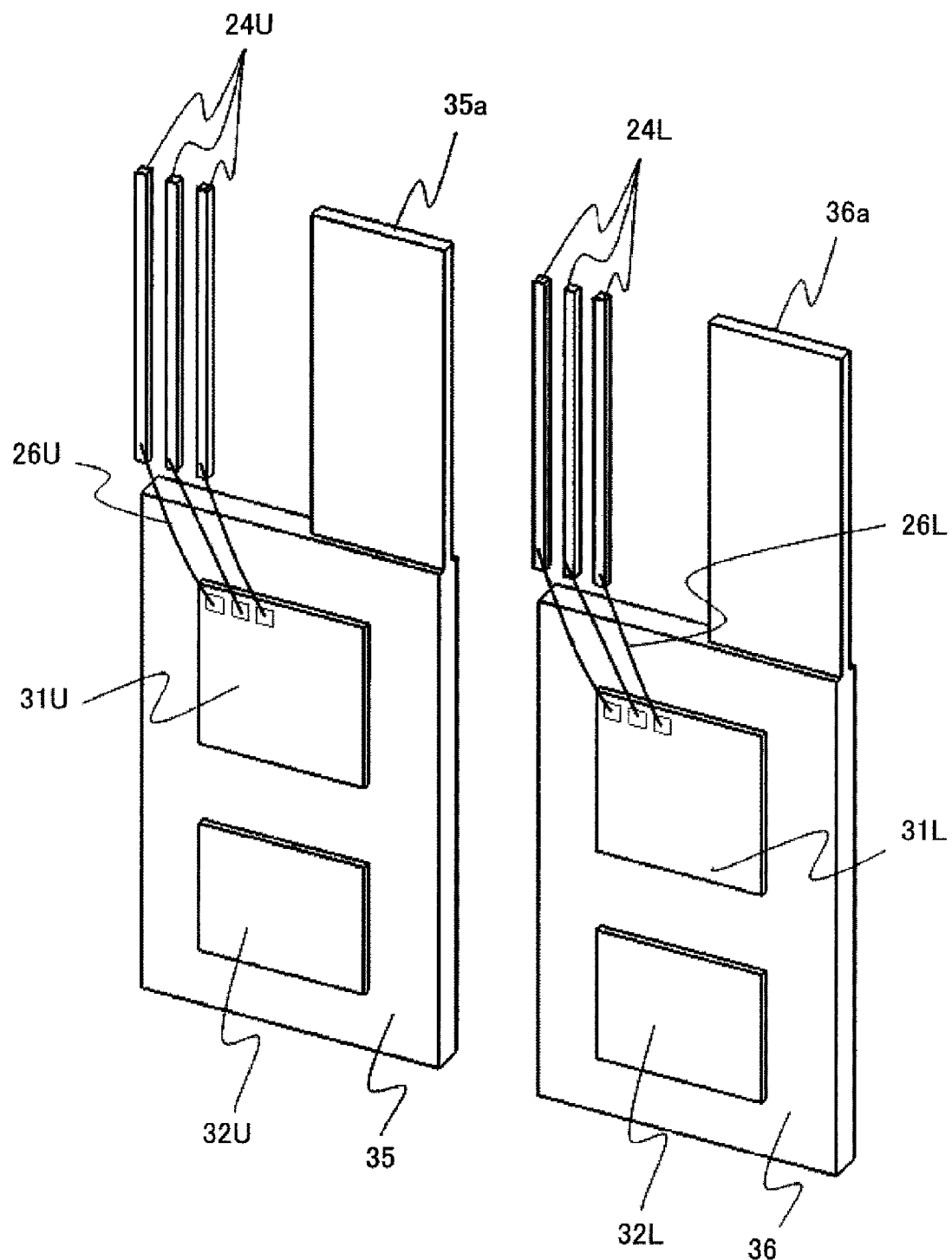
FIG. 6 is a perspective view of the power semiconductor module, from which a conductor plate on a front surface side illustrated in FIG. 5 is removed.

FIG. 3 is an appearance perspective view of a front surface side of the power semiconductor module. FIG. 4 is an appearance perspective view of a back surface side of the power semiconductor module. FIG. 5 is a perspective view of the power semiconductor module from which a first sealing resin illustrated in FIG. 4 is removed. FIG. 6 is a perspective view of the power semiconductor module from which a conductor plate on a front surface side illustrated in FIG. 5 is removed.

On the front surface side of the power semiconductor module 30, as illustrated in FIG. 3, a conductor plate 35 on a DC positive electrode side and a conductor plate 36 on an AC output side are disposed on the same plane. As illustrated in FIG. 3, a first sealing resin 6 formed on the back surface side of the power semiconductor module 30 covers the whole periphery of the conductor plates 35 and 36 while exposing an upper surface 35b of the conductor plate 35 and an upper surface 36b of the conductor plate 36.

An upper surface 6j on a front surface side of the first sealing resin 6 is flush with the upper surface 35b of the conductor plate 35 and the upper surface 36b of the conductor plate 36.

Also, on the back surface side of the power semiconductor module 30, as illustrated in FIG. 4, a conductor plate 33 on an AC output side and a conductor plate 34 on a DC negative electrode side are disposed on the same plane. As illustrated in FIG. 4, the first sealing resin 6 formed on the front surface side of the power semiconductor module 30 covers the whole periphery of the conductor plates 33 and 34 while exposing an upper surface 33b of the conductor plate 33 and an upper surface 34b of the conductor plate 34. An upper surface 6k on a back surface side of the first sealing resin 6 is flush with the upper surface 33b of the conductor plate 33 and the upper surface 34b of the conductor plate 34.

The conductor plate 35 on the DC positive electrode side has a DC positive electrode terminal 35a, and the conductor plate 36 on the AC output side has an AC output terminal 36a. An upper arm circuit is configured by bonding a semiconductor device 31U and a diode 32U to the conductor plate 35 on the DC positive electrode side, and an input and an output of the semiconductor device 31U are connected to multiple signal terminals 24U with wires 26U.

A lower arm circuit is configured by bonding a semiconductor device 31L and a diode 32L to the conductor plate 36 on the AC output side, and an input and an output of the semiconductor device 31L are connected to multiple signal terminals 24L with wires 26L.

Also, as illustrated in FIG. 5, the conductor plate 33 includes a lead 38, and an end of the lead 38 is connected to the conductor plate 35.

One surface side of the semiconductor device 31U and the diode 32U is bonded to the conductor plate 35 through a metal bonding material 61, and one surface side of the semiconductor device 31L and the diode 32L is bonded to the conductor plate 36 through a metal bonding material 61 (see FIG. 2). As the metal bonding material, for example, a solder material, a silver sheet, and a low-temperature-sinterable bonding material including fine metal particles are used. Also, another surface side of the semiconductor device 31U and the diode 32U is bonded to the conductor plate 33 through a metal bonding material 61, and another surface side of the semiconductor device 31L and the diode 32L is bonded to the conductor plate 34, through a metal bonding material 61 (see FIG. 2). In this manner, the semiconductor devices 31U and 31L and the diodes 32U and 32L are sandwiched by pairs of the conductor plates 33 to 36 through the metal bonding materials 61.

A purpose of the first sealing resin 6 in the power semiconductor module 30 is to support the conductor plates 33 to 36, making it possible to facilitate handling in a manufacturing process and improve productivity. The first sealing resin 6, for example, by using an epoxy resin, covers peripheral side surfaces of the conductor plates 33 to 36 and peripheral side surfaces of the semiconductor devices 31U and 31L and the diodes 32U and 32L while exposing the upper surfaces 33b to 36b of the conductor plates 33 to 36 and exposing ends of the signal terminals 24U and 24L by transfer molding.

[Sealing Structure of Power Semiconductor Module and Metal Case]

As illustrated in FIG. 2, front and back surfaces of the power semiconductor module 30 are in close contact with an inner surface of the metal case 40 by an insulating resin film 51. The insulating resin film 51 has an area capable of covering a whole region, in which the heat dissipation fins 42 arranged to the heat dissipation units 41a and 41b of the metal case 40 are formed. More specifically, the power semiconductor module 30 includes the conductor plates 33 to 36, the semiconductor devices 31U and 31L disposed therebetween, the diodes 32U and 32L, and the sealing resin 6 covering side surfaces between the conductor plates 33 and 34 and between the conductor plates 35 and 36.

A second sealing resin 52 is formed around the insulating resin film 51. An oxide layer (rough surface layer) 46 is formed on an inner surface of the metal case 40 as illustrated by a dotted line in FIG. 2. The second sealing resin 52 is in close contact with the oxide layer 46.

Figure 7:
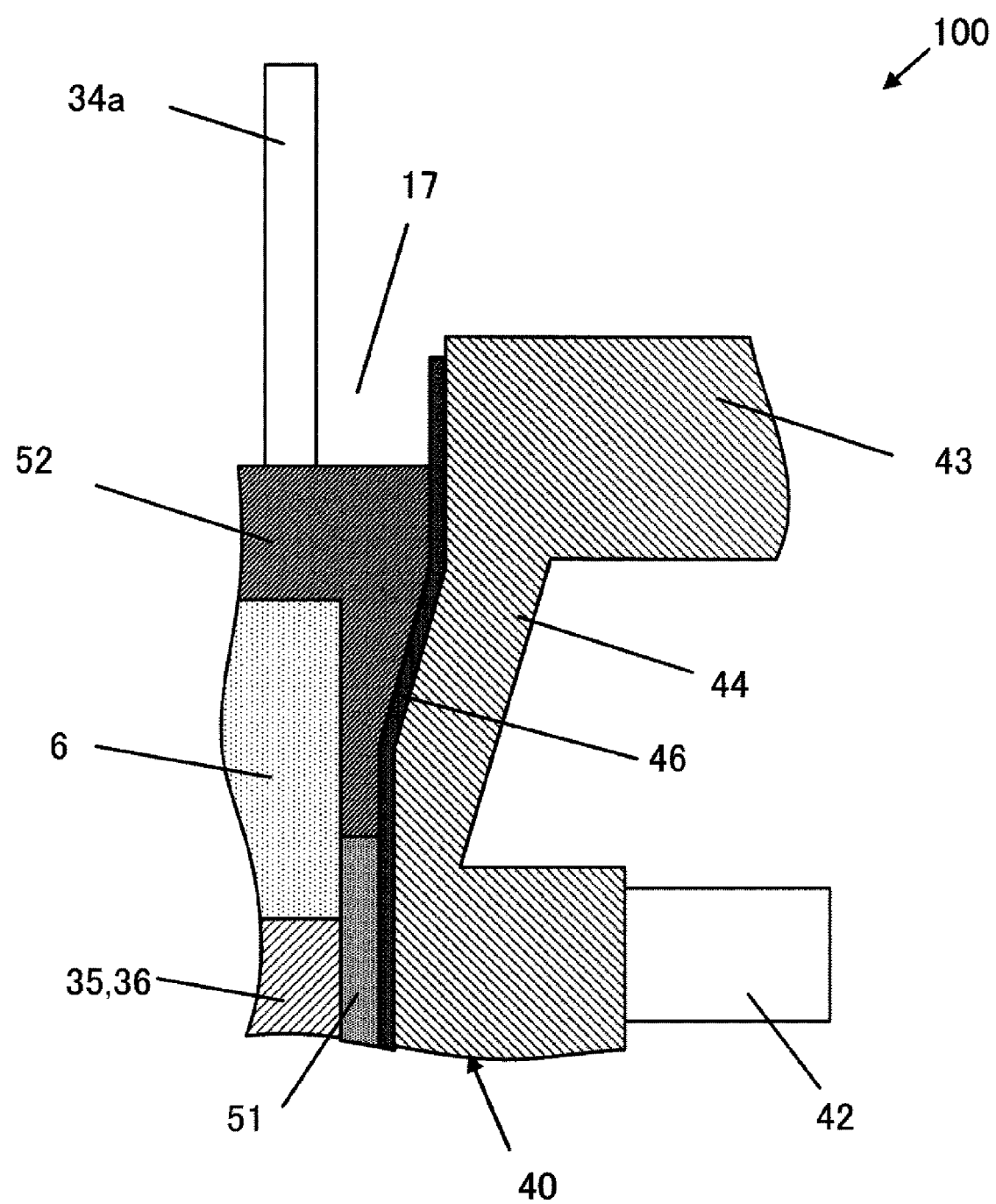
FIG. 7 is an enlarged view of a region VII illustrated in FIG. 2.

FIG. 7 is an enlarged view of a region VII illustrated in FIG. 2.

The metal case 40 is formed of, for example, aluminum or aluminum-based metal such as aluminum alloy. The oxide layer 46 is formed by performing an alumite treatment to the aluminum-based metal. The alumite treatment is a treatment for forming an aluminum oxide film (an anodized layer) by electrolyzing aluminum as an anode by using sulfuric acid, oxalic acid, or phosphoric acid in a treatment bath, and electrochemically oxidizing a surface of the aluminum. Especially, an alumite treatment with sulfuric acid is a preferable method.

The oxide layer 46 formed by the alumite treatment is thicker than an oxide film of several nm thick, which is formed by air exposure, and a stable film of 1 μm or more in thickness can be formed. If the thickness of the oxide layer 46 is 0.5 μm or more, sufficient adhesiveness can be obtained. The oxide layer 46 is generally not too thick; however, considering operating efficiency, the maximum thickness is preferably assumed to be approximately 30 μm.

The second sealing resin 52 is formed around the insulating resin film 51. An inner peripheral side of the second sealing resin 52 corresponding to an outer periphery of the insulating resin film 51 firmly adheres to, without overlapping, an outer peripheral side of the insulating resin film 51. Also, an inner surface of the second sealing resin 52 firmly adheres to front and back surfaces of the first sealing resin 6 and a peripheral side surface of the first sealing resin 6. Front and back surfaces of an outer surface of the second sealing resin 52 firmly adhere to the oxide layer 46.

A surface of the oxide layer 46 formed by the alumite treatment becomes a dense porous structure. The second sealing resin 52 brings about an anchor effect by infiltrating in small holes (dents) in the porous structure of the oxide layer 46. Also, the oxide layer 46 has a larger chemical bonding force with a resin material than that of aluminum-based metal which does not form the oxide layer 46. Therefore, adhesiveness between the second sealing resin 52 and the oxide layer 46 can dramatically improve, compared with the case where the oxide layer is not formed.

[Method for Manufacturing Power Module]

A method for manufacturing the power module 100 from the power semiconductor module 30 will be described with reference to FIGS. 8 to 10.

Figure 8:
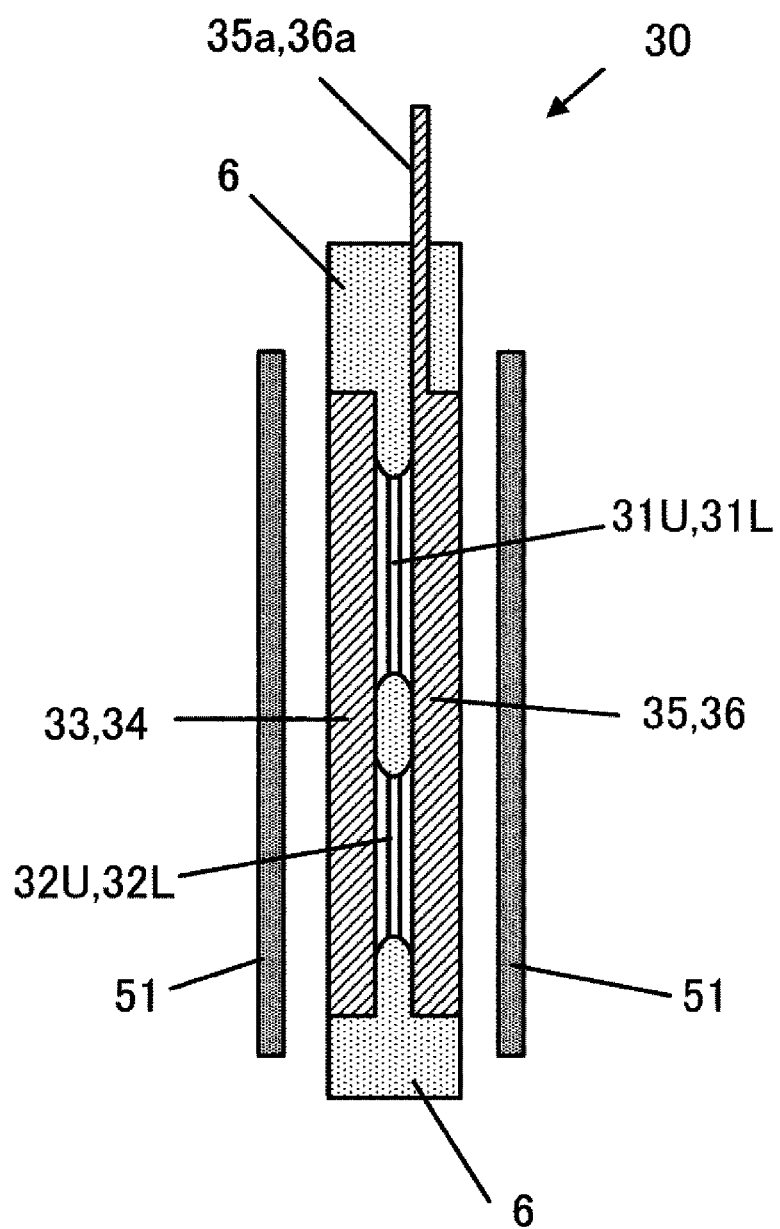
FIG. 8 is a sectional view of the power semiconductor module in a predetermined process for describing a manufacturing method according to embodiments of the present invention.

As illustrated in FIG. 8, the first sealing resin 6 is formed by transfer molding on peripheral side surfaces of the conductor plates 33 to 36 sandwiching the semiconductor devices 31U and 31L and the diodes 32U and 32L, to form the power semiconductor module 30.

The insulating resin film 51 is formed on front and back surfaces of the power semiconductor module 30. The insulating resin film 51 is preferably formed by a method in which a sheeted member is bonded to the power semiconductor module 30. However, it may be formed by a method in which fluid resin is printed or applied.

Figure 9:
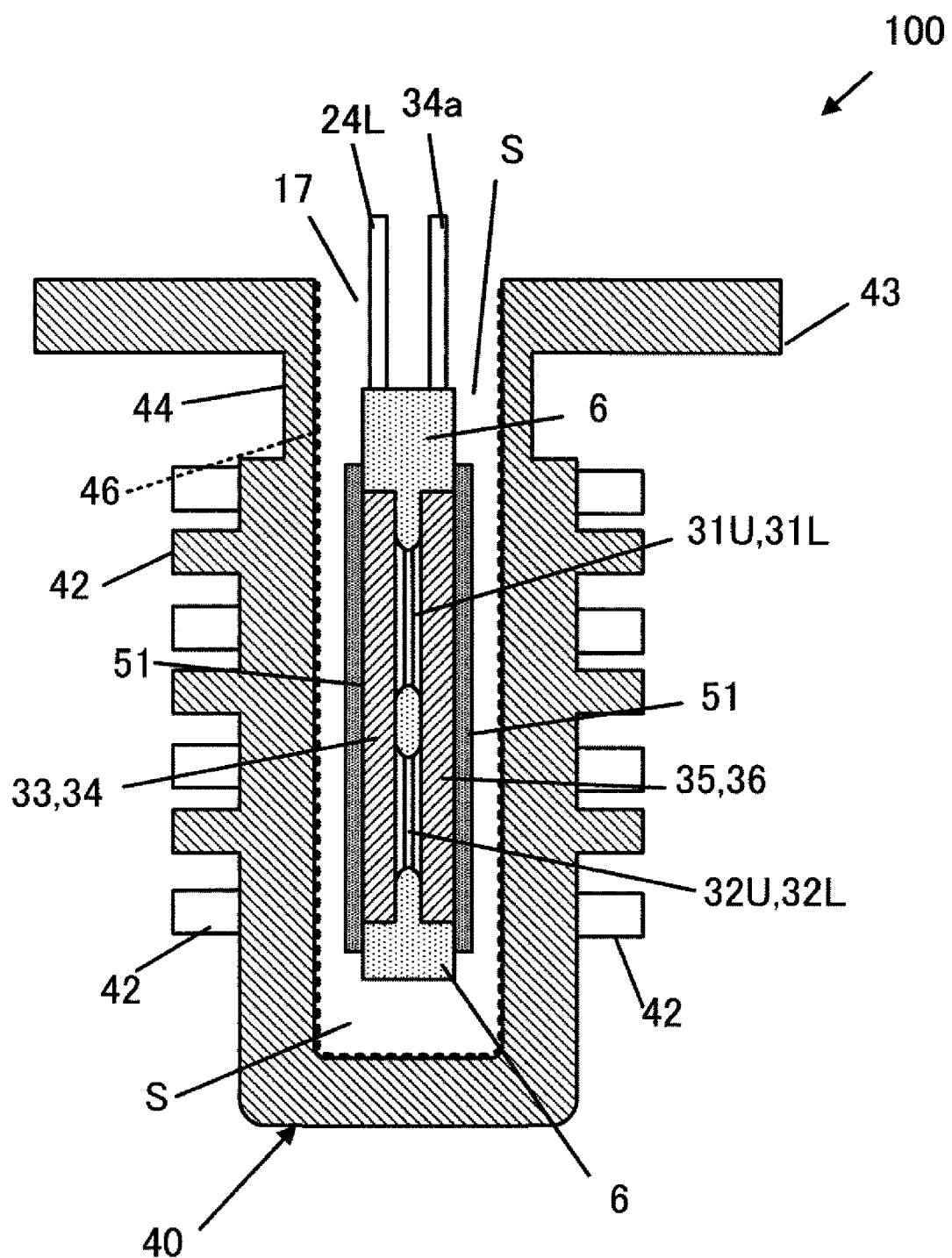
FIG. 9 is a sectional view for describing a process following the process described in FIG. 8.

As illustrated in FIG. 9, the power semiconductor module 30, which has the insulating resin films 51 on front and back surfaces thereof, is inserted into the metal case 40 from the insertion opening 17 of the metal case 40. In the metal case 40, the thin wall portion 44 is formed at right angles to the flange 43 at this point, more specifically, in parallel with the heat dissipation units 41*a* and 41*b*. Also, the oxide layer 46 is formed on an inner surface of the metal case 40.

Figure 10:
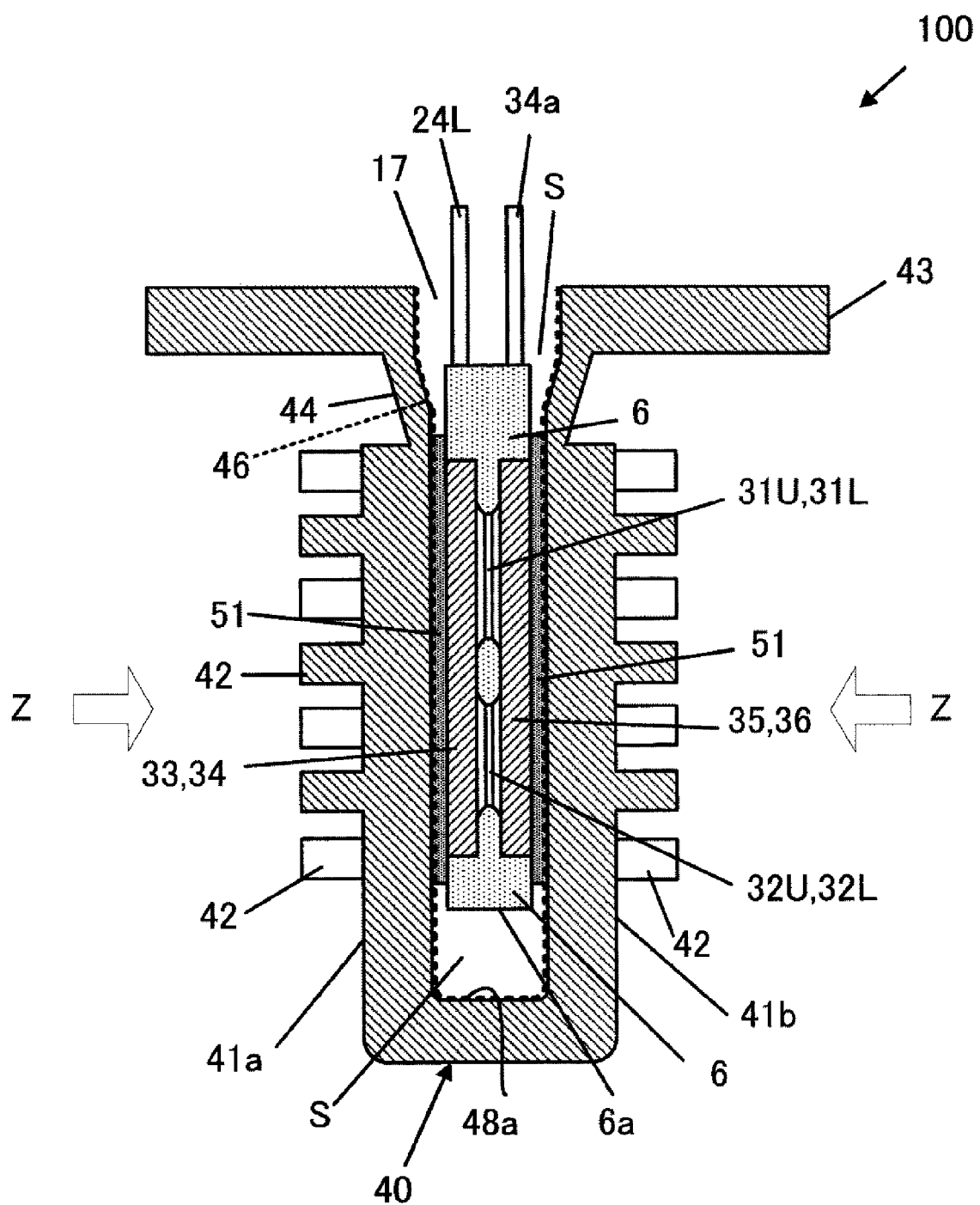
FIG. 10 is a sectional view for describing a process following the process described in FIG. 9.

As indicated by arrows in FIG. 10, the heat dissipation units 41*a* and 41*b* are pressurized in Z directions, and the thin wall portion 44 is deformed inward of the case. An inner surface of each of the heat dissipation units 41*a* and 41*b* firmly adheres to the power semiconductor module 30. If the thickness of the power semiconductor module 30 is equal to or greater than that of the inner surface of the metal case 40, and the power semiconductor module 30 is pressure-welded to the inner surface of the metal case 40, the above process is not needed.

As illustrated in FIG. 10, a space S is formed between an inner surface of the metal case 40 and a whole peripheral surface of the power semiconductor module 30.

In a state illustrated in FIG. 10, a fluid resin material is injected from the insertion opening 17 of the metal case 40 to fill the space S. By hardening the resin material by cooling, the power module 100 illustrated in FIG. 2, in which the space S is filled with the second sealing resin 52, can be obtained.

According to the method for manufacturing the power module according to the above embodiment, the second sealing resin 52 is formed by injecting a resin material in the space S formed between the metal case 40 and the power semiconductor module 30. The resin injected in the space S has fluidity. Therefore, the resin fills small holes in a porous structure of the oxide layer 46 formed on the inner surface of the metal case 40. As a result, adhesiveness between the second sealing resin 52 and the metal case 40 can improve by an anchor effect.

[Variations]

Figure 11:
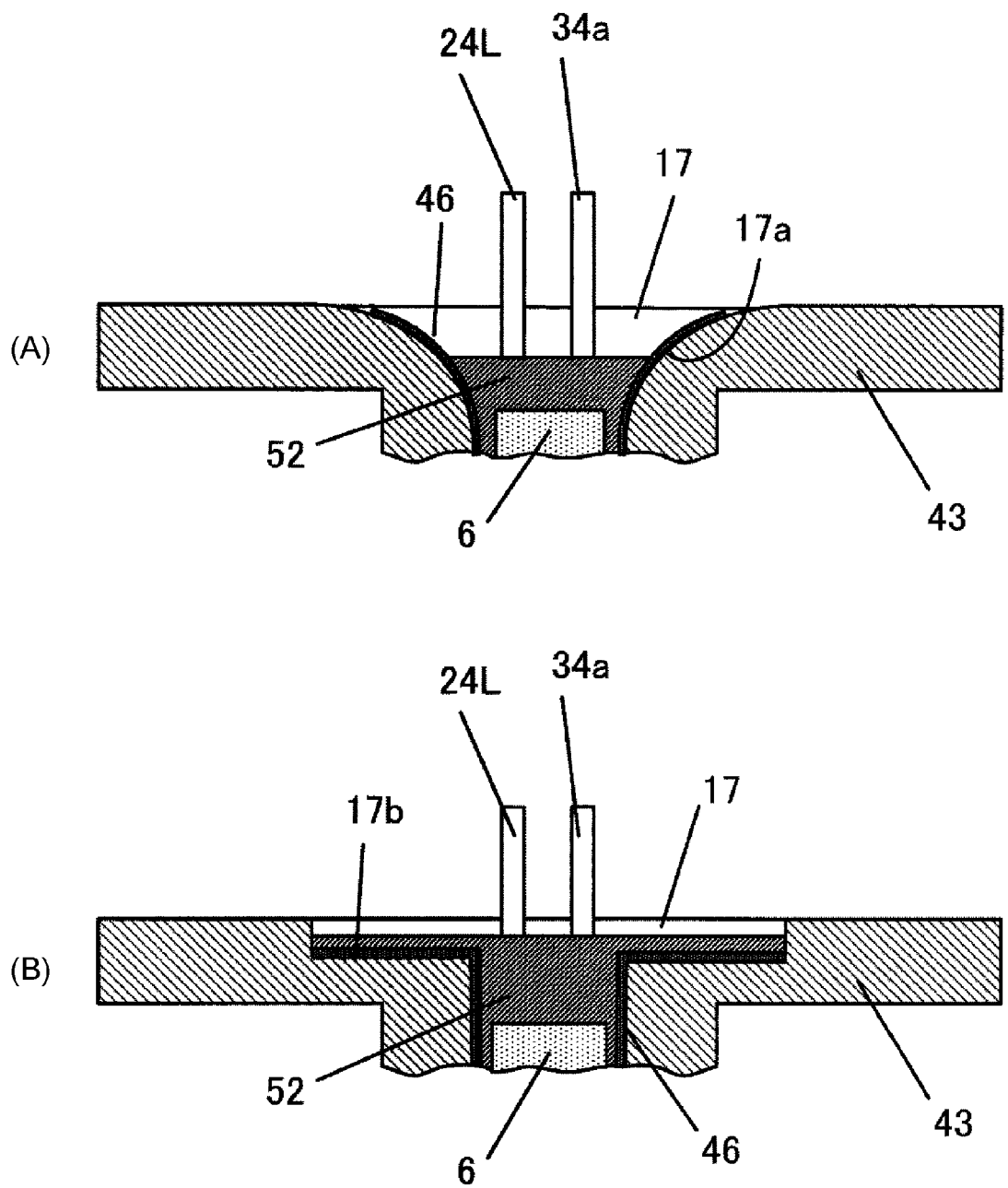
FIGS. 11(A) and 11(B) are views illustrating variations of the power module according to the present invention.

Each of FIGS. 11(A) and 11(B) illustrates a variation of an embodiment, and is an enlarged sectional view of the vicinity of the insertion opening 17 of the metal case 40.

FIG. 11(A) is a view of the insertion opening 17 of the metal case 40, to which a chamfer 17*a* is arranged. Although FIG. 11(A) illustrates a cross sectional surface, the chamfer 17*a* is preferably formed on a whole peripheral surface.

FIG. 11(B) is a view of the insertion opening 17 of the metal case 40, to which a step 17*b* wider than a space between the heat dissipation units 41*a* and 41*b* is applied. Although FIG. 11(B) illustrates a cross sectional surface, the step 17*b* is preferably formed on a whole peripheral surface of the insertion opening 17.

The second sealing resin 52 is filled in the space S by injecting a fluid resin material between the metal case 40 and the power semiconductor module 30.

A position of an upper surface of the second sealing resin 52 is varied by variation in an amount of the resin material for filling the space S. In the case where the chamfer 17*a* is provided to the insertion opening 17 as illustrated in FIG. 11(A), or the insertion opening 17 is the wide step 17*b* as illustrated in FIG. 11(B), and accordingly an area of the insertion opening 17 side is enlarged, fluctuation in the upper surface position of the second sealing resin 52 due to variation in the amount of the resin material can be reduced. Therefore, the injection amount of the resin material can be easily controlled, and productivity can improve.

The above embodiment illustrates a structure in which the oxide layer 46 is formed on a whole inner surface of the metal case 40. However, the second sealing resin 52 is formed on a whole peripheral side surface of the first sealing resin 6, and water infiltrating from the insertion opening 17 is blocked. Therefore, the oxide layer 46 may be arranged just in a region firmly adhering to the second sealing resin 52 in the metal case 40.

Also, the oxide layer 46 may be formed on an outer surface of the metal case 40 to improve a production efficiency.

[Circuit Configuration of Power Semiconductor Module]

Figure 12:
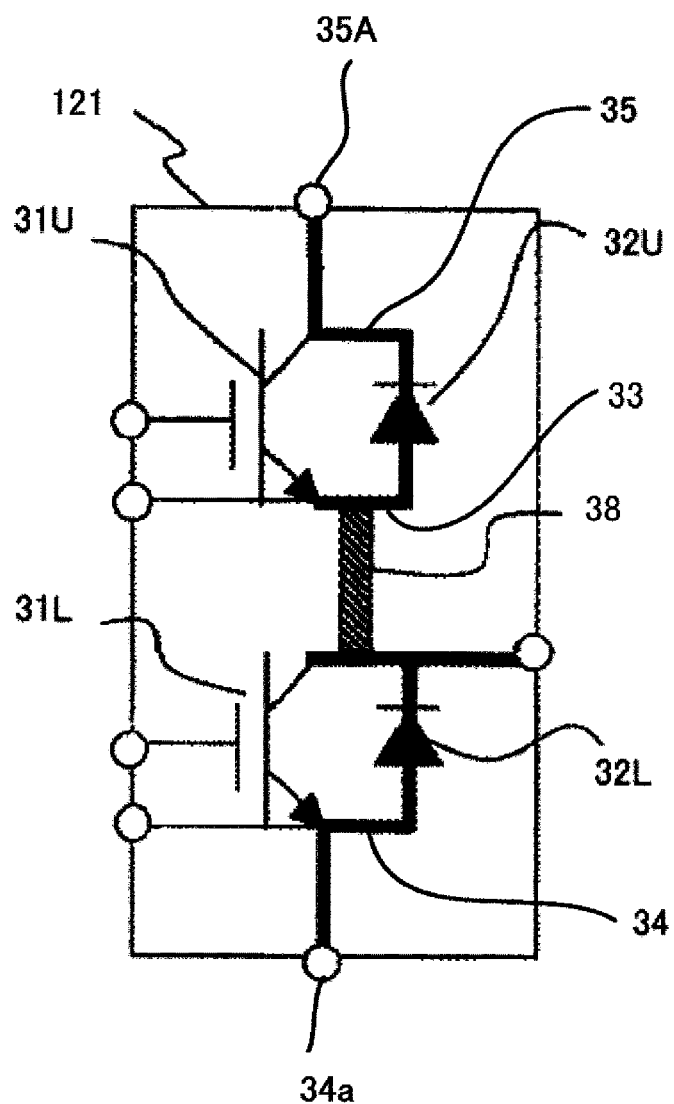
FIG. 12 is a diagram illustrating an example of a circuit configuration of one phase of an inverter in a power converter configured by the power module according to the present invention.

FIG. 12 is a diagram illustrating an exemplary configuration of a circuit incorporated into the power module according to the present invention.

The circuit illustrated in FIG. 12 indicates a circuit 121 corresponding to one phase of an inverter circuit.

A power transistor including an insulated gate bipolar transistor (IGBT) is used for the semiconductor devices 31U and 31L of the power semiconductor module 30.

The conductor plate 35 is connected to a collector electrode of the semiconductor device 31U on an upper arm side and a cathode electrode of the diode 32U on the upper arm side. The conductor plate 36 is connected to a collector electrode of the semiconductor device 31L on a lower arm side and a cathode electrode of the diode 32L on the lower arm side.

Second Embodiment

Figure 13:
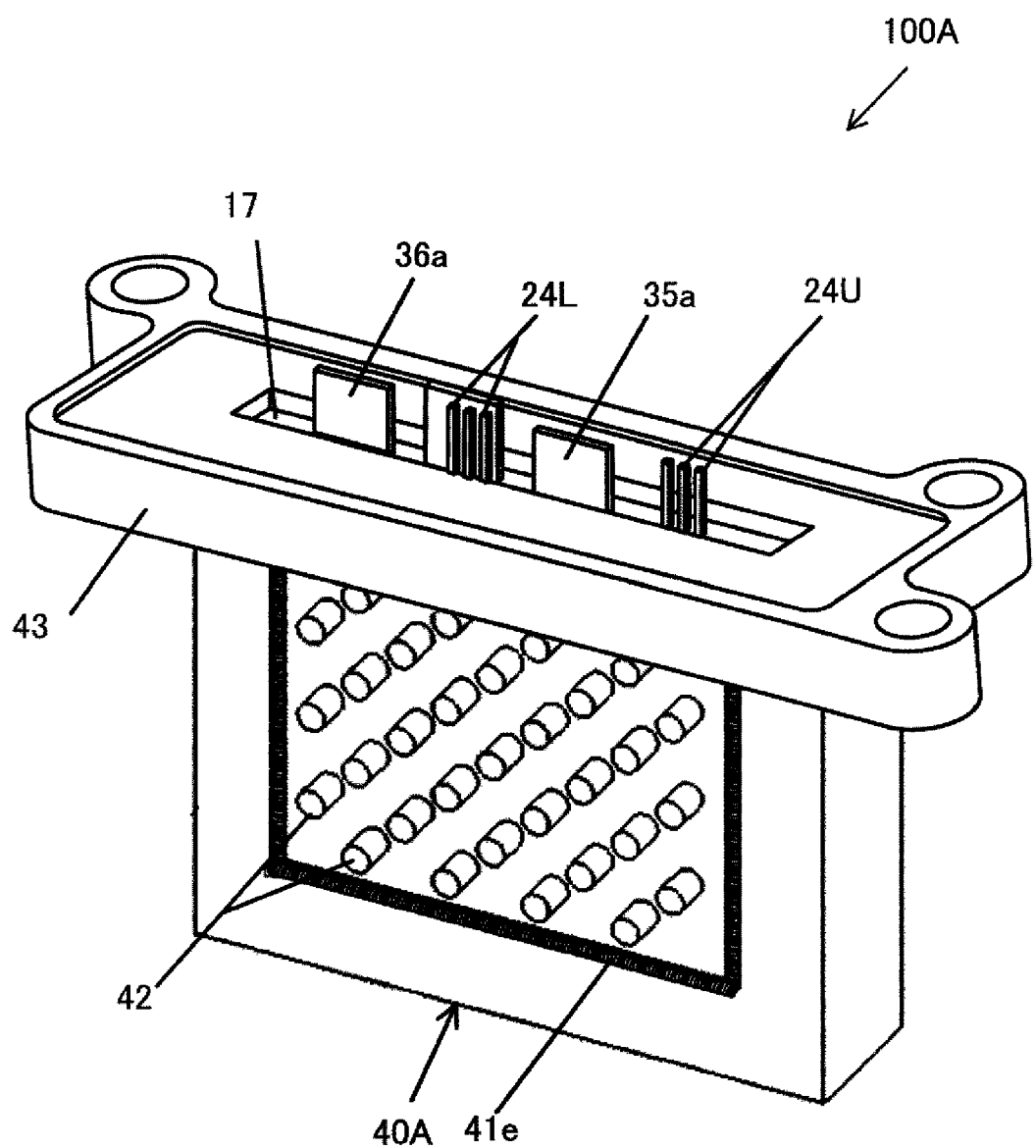
FIG. 13 is an appearance perspective view illustrating a second embodiment of the power module according to the present invention.
Figure 14:
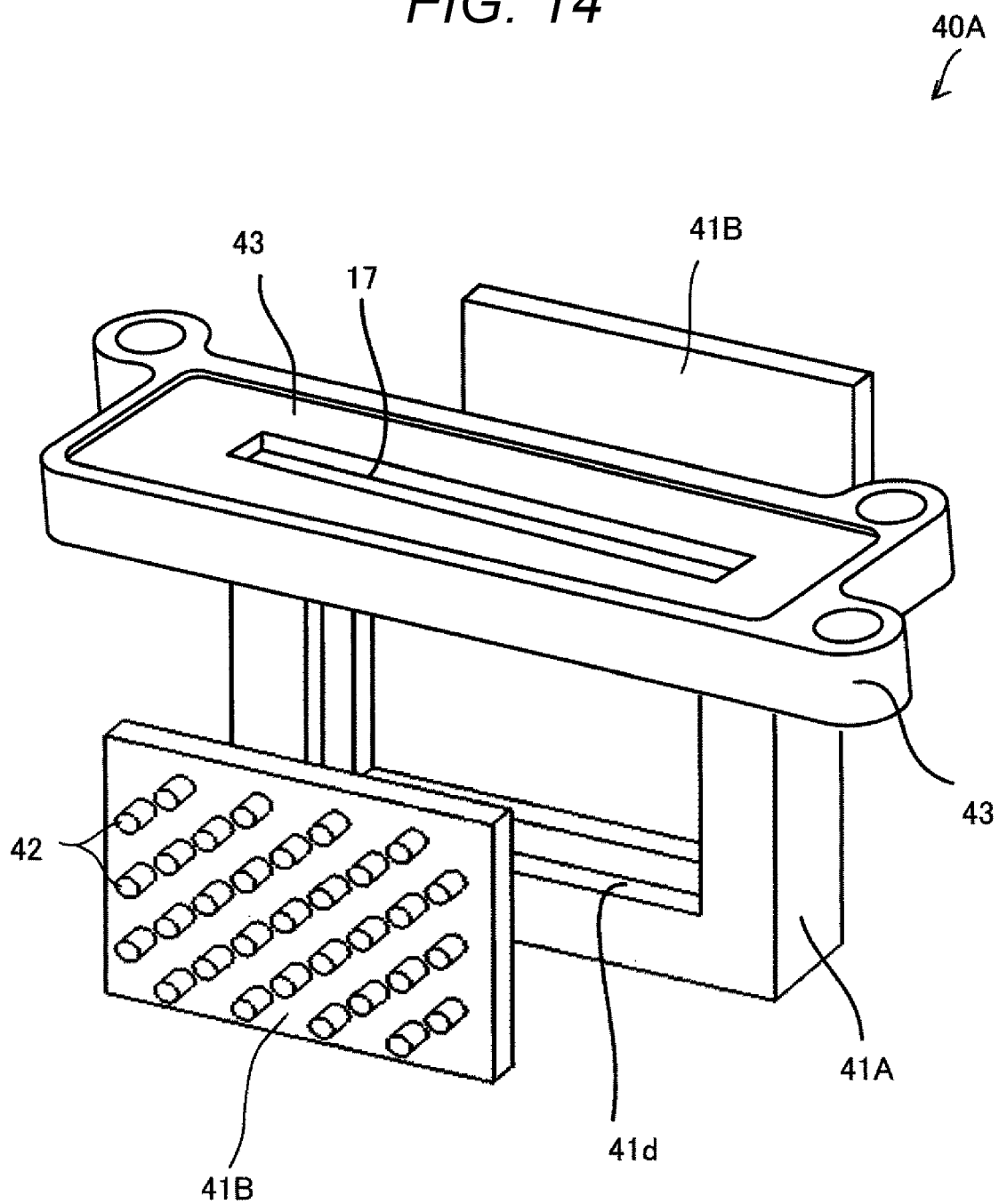
FIG. 14 is an exploded perspective view of a metal case illustrated in FIG. 13.

FIG. 13 is an appearance perspective view illustrating a second embodiment of a power module according to the present invention. FIG. 14 is an exploded perspective view of a metal case illustrated in FIG. 13.

A power module 100A according to the second embodiment is different from the power module 100 according to the first embodiment in that a metal case 40A includes a frame 41A and a pair of fin plates 41B on which heat dissipation fins 42 are formed.

The frame 41A includes a flange 43, and an opening 41d is formed so as to fit to the fin plates 41B on front and back surfaces. The fin plate 41B fits to the opening 41d of the frame 41A, and an outer peripheral edge of the fin plate 41B and a peripheral edge of the opening 41d of the frame 41A are bonded at a joint 41e by welding. As a welding method, for example, friction stir welding (FSW), laser welding, and brazing are applicable.

An oxide layer is formed on inner surfaces of the frame 41A and the fin plates 41B by a method such as an alumite treatment as in the first embodiment. The oxide layer may be formed just on an inner surface of the frame 41A, and may not be formed on the inner surfaces of the fin plates 41B.

If the oxide layer is formed on an outer surface of the above-described joint 41e between the frame 41A and the fin plate 41B, corrosion resistance can improve, and it is especially preferable when the power module 100A is used by being immersed in a cooling liquid. The oxide layer can be formed by the alumite treatment as in the inner surface side.

The oxide layer may be formed on a whole outer surface of the frame 41A and the fin plates 41B to improve workability for forming the oxide layer.

Others are similar to the first embodiment, and similar effects can be obtained.

Third Embodiment

Figure 15:
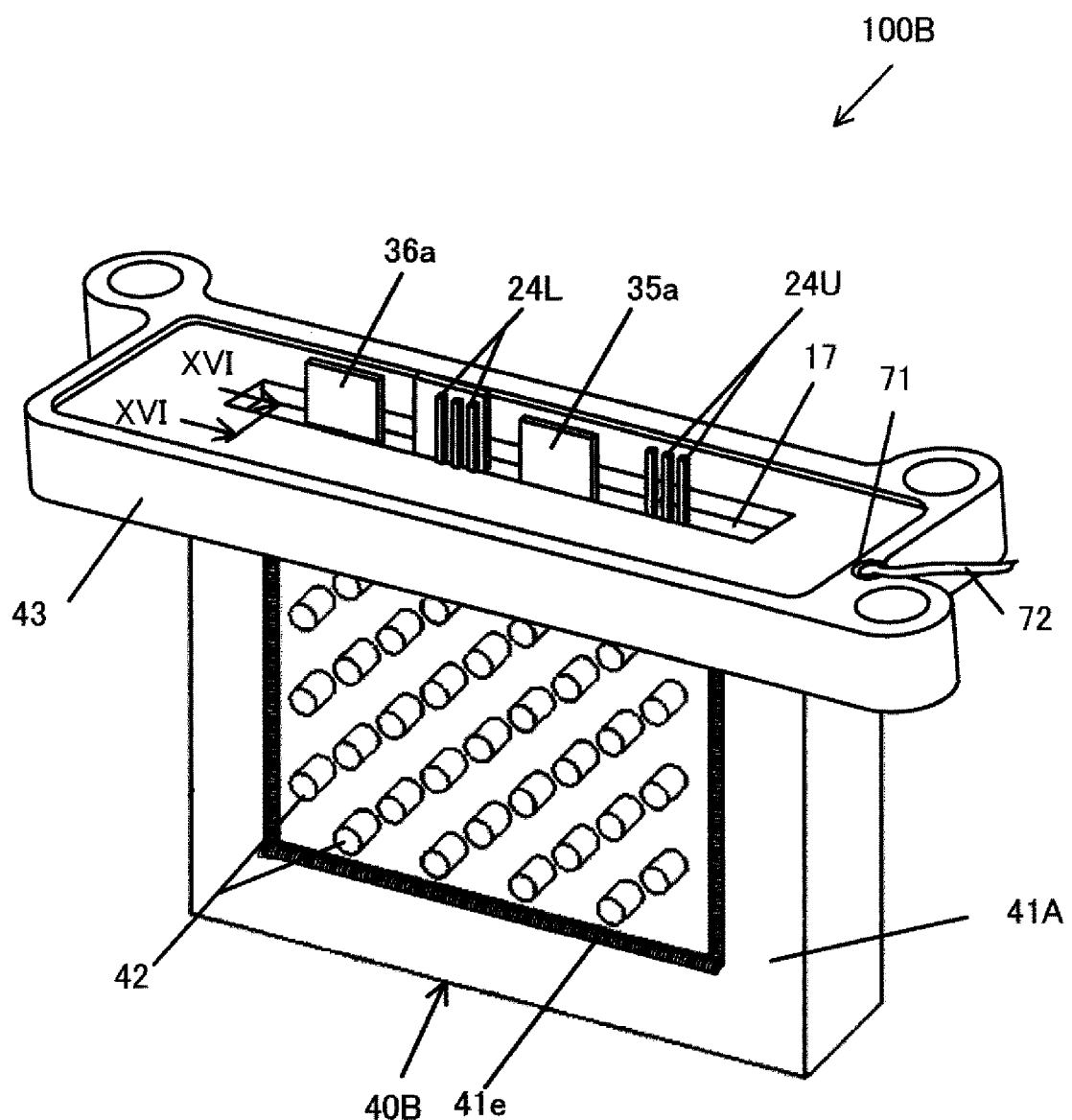
FIG. 15 is an appearance perspective view illustrating a third embodiment of the power module according to the present invention.
Figure 16:
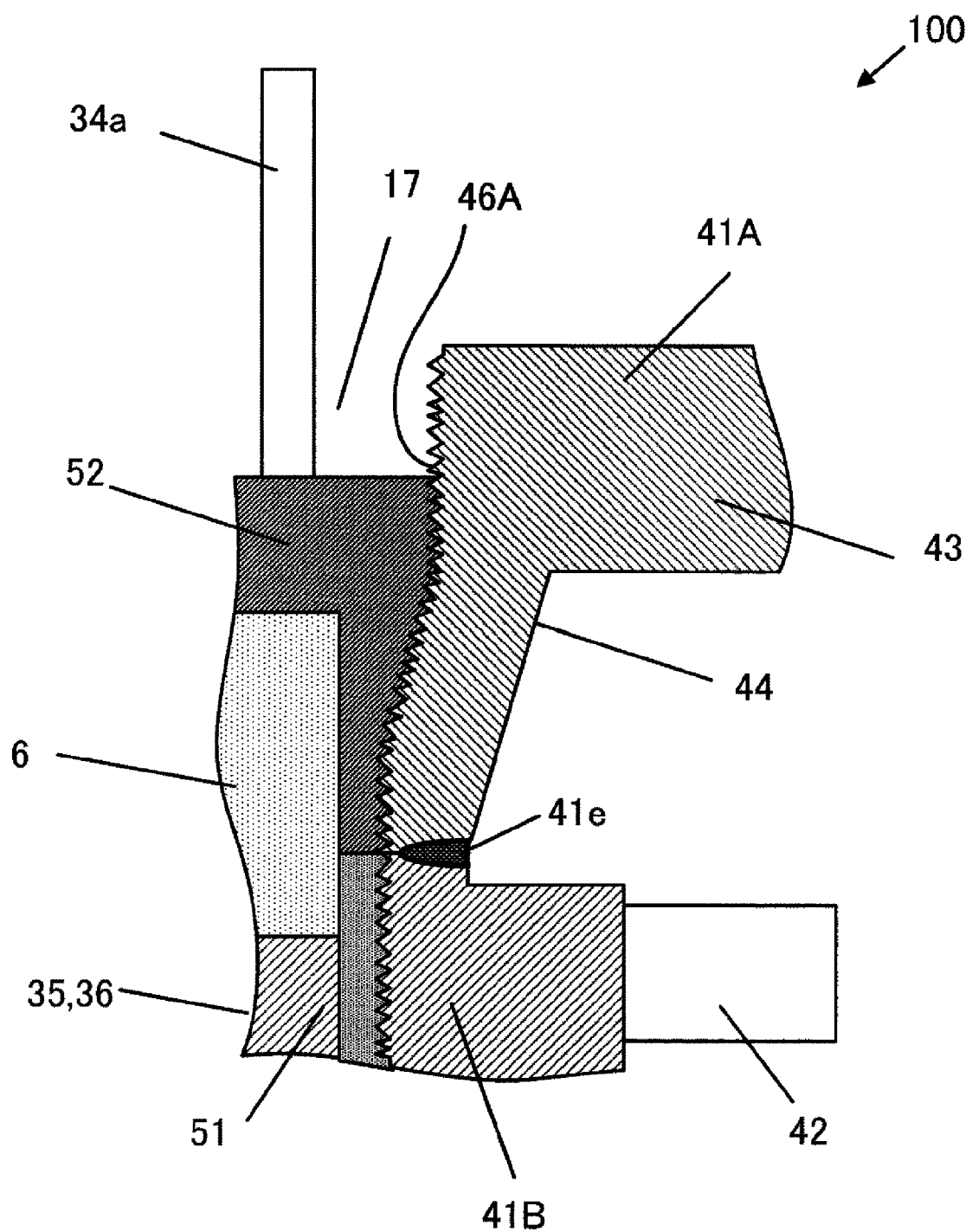
FIG. 16 is a sectional view of line XVI-XVI illustrated in FIG. 15.

FIG. 15 is an appearance perspective view illustrating a third embodiment of the power module according to the present invention. FIG. 16 is a sectional view of line XVI-XVI illustrated in FIG. 15.

In a power module 100B illustrated as the third embodiment, a metal case 40B is configured by bonding a frame 41A and a fin plate 41B at a joint 41e, as in the second embodiment.

However, an oxide layer is not formed on inner surfaces of the frame 41A and the fin plate 41B, and instead fine irregularities are formed thereon. More specifically, in the third embodiment, a rough surface layer having dents is formed by an irregular layer 46A.

The irregular layer 46A can be formed by blasting before the frame 41A and the fin plate 41B are bonded. Also, the irregular layer 46A can be formed by dry etching or wet etching before or after the frame 41A and the fin plate 41B are bonded. As described in the first and second embodiments, the irregular layer 46A may be formed just on the frame 41A. Surface roughness of the irregular layer 46A is preferably approximately 0.5 μm to 30 μm in consideration of productivity, although a rougher surface is preferable in view of adhesiveness.

In the case where the metal case 40B is configured with the frame 41A and a pair of the fin plates 41B, there is an advantage that each of them can be formed of a material suitable for functions thereof. For example, the frame 41A is formed of ADC for die casting, and the fin plates 41B are formed of A1050 with excellent heat dissipation.

In the third embodiment, as in the second embodiment, an oxide layer can be formed on an outer surface of the joint 41e or on whole outer surfaces of the frame 41A and the fin plates 41B after the frame 41A and the fin plates 41B have been bonded. As illustrated in FIG. 15, a lead for grounding 72 may be connected by providing a terminal for grounding 71 to the metal case 40B. FIG. 15 illustrates a structure in which the terminal for grounding 71 is provided to a flange 43 of the frame 41A, and the lead for grounding 72 is connected to the terminal for grounding 71. In this case, in the frame 41A and the fin plates 41B, if a material, by which the thickness of an oxide film becomes thin, is used for a member to form the terminal for grounding 71, the oxide film is easily removed when the terminal for grounding 71 is formed.

Others except for the above are similar to the second embodiment, and similar effects to those in the second embodiment are obtained in the third embodiment.

[Application to Power Converter]

The above-mentioned power module is applicable to, for example, a power converter mounted on a hybrid car and an electric car, a power converter for a train, a ship, or an airplane, an industrial power converter used for a control apparatus of an electric motor for driving plant equipment, and a domestic power converter used for a control apparatus of an electric motor for driving a household solar power system and a household electric appliance.

(Control Circuit of Power Converter)

Figure 17:
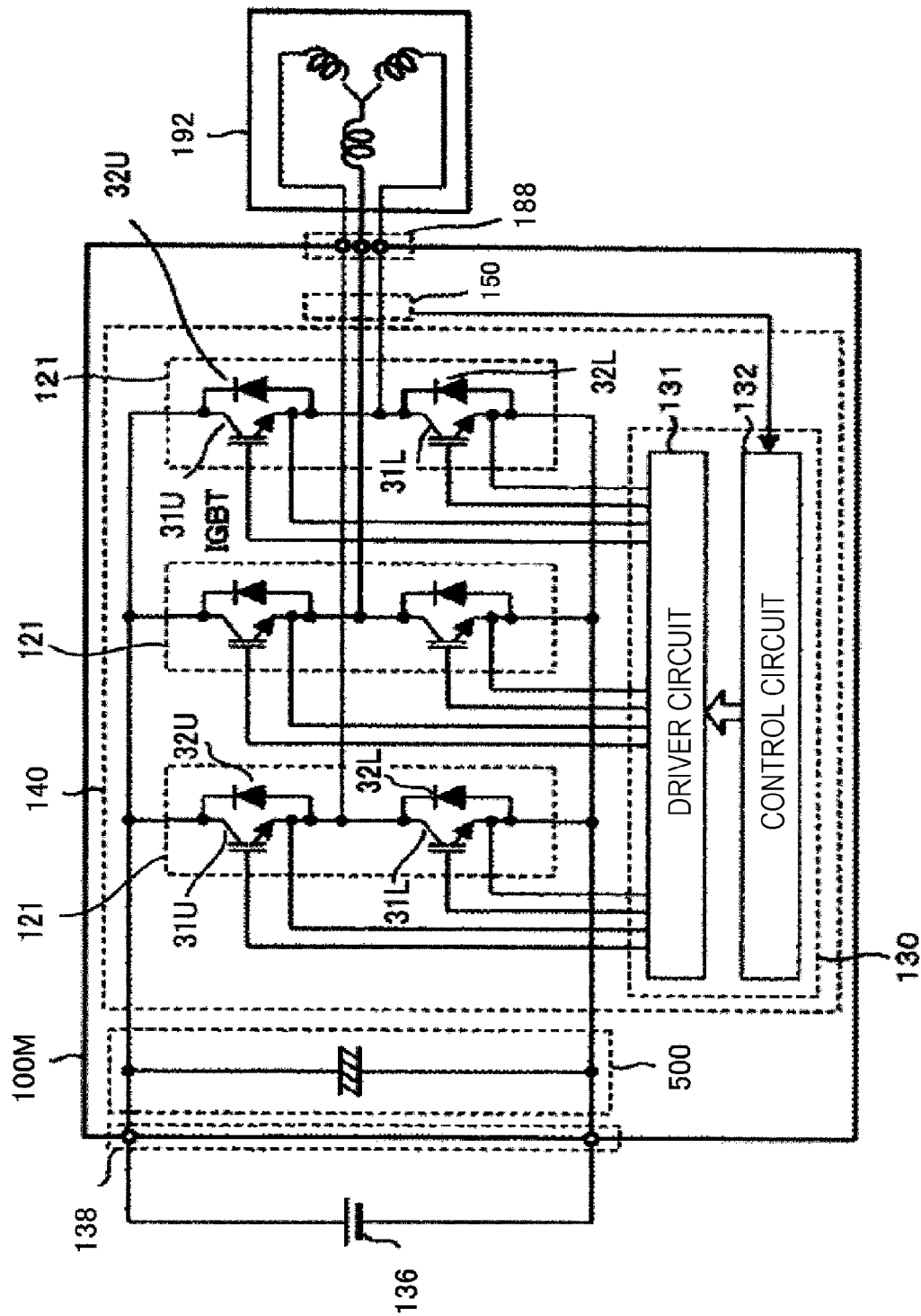
FIG. 17 is a diagram illustrating an example of the power converter configured by the power module according to the present invention.

FIG. 17 is a diagram illustrating an example of the power converter configured by the power module according to the present invention.

As illustrated in FIG. 17, a power converter 100M is connected to a battery 136 and a motor generator 192, converts a DC current supplied from the battery 136 into a three-phase AC current, and supplies the AC current to the motor generator 192.

The power converter 100M includes a capacitor module 500 for stabilizing and smoothing a DC current supplied from the battery 136, and an inverter 140 for generating a three-phase AC current from the DC current. Also, the inverter 140 includes upper and lower arm series circuits 121 constituting three phases, i.e., a U phase, a V phase, and a W phase, and a control module 130 for controlling the upper and lower arm series circuits 121.

In the inverter 140, each of the upper and lower arm series circuits 121 has a circuit configuration described with reference to FIG. 12. In each of the upper and lower arm series circuits 121, two current switching circuits including a circuit connecting in parallel with a semiconductor device 31 and a diode 32 are arranged in series.

Upper and lower ends of the upper and lower arm series circuits 121 are connected to a positive electrode and a negative electrode of the battery 136, respectively, through a DC connector 138. The current switching circuit, including a semiconductor device 31U and a diode 32U disposed on an upper side (positive electrode side), operates as an upper arm. Also, the current switching circuit, including a semiconductor device 31L and a diode 32L disposed on a lower side (negative electrode side), operates as a lower arm.

In the inverter 140, three-phase AC currents u, v, and w are output from a center of each of the upper and lower arm series circuits 121, more specifically a joint between the upper and lower current switching circuits, and the output three-phase AC currents u, v and w are supplied to the motor generator 192 through an AC connector 188.

Also, the control module 130 includes a driver circuit 131 for drive control of the three upper and lower arm series circuits 121 and a control circuit 132 for supplying a control signal to the driver circuit 131. Herein, a signal output from the driver circuit 131 is supplied to each of the semiconductor devices 31U and 31L of upper arms and lower arms of the power module 100. By controlling switching operation of the semiconductor devices, amplitude and phases of the AC currents u, v, and w output from each of the upper and lower arm series circuits 121 are controlled.

The control circuit 132 includes a microcomputer for calculating a switching timing of each of the semiconductor devices 31U and 31L in the three upper and lower arm series circuits 121. As input information, a target torque value required for the motor generator 192, a value of a current to be supplied from the upper and lower arm series circuits 121 to the motor generator 192, and a magnetic pole position of a rotor of the motor generator 192 are input to the microcomputer.

Among the input information, the target torque value is based on a command signal output from a host control apparatus (not illustrated). The current value is based on a detection signal of a current sensor 150 for detecting a current value of an AC current output from each of the upper and lower arm series circuits 121. The magnetic pole position is based on a detection signal of a rotating magnetic pole sensor (not illustrated) provided to the motor generator 192.

The control module 130 has a function to detect abnormality, such as an overcurrent, an overvoltage, and an overtemperature, and protects the upper and lower arm series circuits 121. Emitter electrodes of the semiconductor devices 31U and 31L of each arm are connected to the driver circuit 131. The driver circuit 131 detects an overcurrent in the emitter electrode of each of the semiconductor devices 31U and 31L. Switching operation of the semiconductor devices 31U and 31L, in which an overcurrent has been detected, is stopped to protect the devices from the overcurrent.

Signals from a temperature sensor (not illustrated) provided to the upper and lower arm series circuits 121 and signals from a detection circuit for detecting a DC voltage applied to both ends of the upper and lower arm series circuits 121 are input to the control circuit 132. Based on the signals, abnormality such as an overtemperature and an overvoltage are detected. In the case where abnormality such as an overtemperature and an overvoltage has been detected, switching operations of all the semiconductor devices 31U and 31L are stopped to protect the whole power module 100 from the abnormality such as an overtemperature and an overvoltage.

In the above-mentioned power converter 100M, the current switching circuit including the semiconductor devices 31U and 31L and the diodes 32U and 32L may be configured by using a metal-oxide-semiconductor field-effect transistor (MOSFET). Also, the three upper and lower arm series circuits 121 may include two upper and lower arm series circuits and output two-phase AC currents. Furthermore, the power converter 100M may have almost the same circuit configuration as that of FIG. 1 that converts a three-phase (two-phase) AC current into a DC current.

The power converter 100M can be used for an electrical system for driving a vehicle with an in-vehicle electrical system mounted on an electric car and a hybrid car.

The power modules 100, 100A, and 100B illustrated as the present embodiments (hereinafter collectively indicated as "100") can be applied to the above-mentioned power converter 100M.

In such case, the power module 100 is stored in a cooling jacket provided in the power converter. A cooling water path is formed in the cooling jacket. The power module 100 is disposed so as to be projected into the cooling water path, and cooling water directly come into contact with surfaces of heat dissipation units 41a and 41b. A capacitor module is disposed on a lower side of the power module 100. A control circuit substrate including a control circuit is laminated on an upper side of the power module 100. A detail of a power converter including the power module 100, the capacitor module, and the control circuit substrate is disclosed, for example, in JP 2010-110143 A.

As described above, the following effects can be obtained according to each of the above embodiments.

(1) The oxide layer (rough surface layer) 46 or the irregular layer (rough surface layer) 46A is formed on an inner surface of the metal case 40, and the second sealing resin 52 formed around the power semiconductor module 30 fills dents of the rough surface layer 46 or 46A and adheres firmly thereto. As a result, adhesiveness between the second sealing resin 52 and the inner surface of the metal case 40 can improve by an anchor effect. Accordingly, sealing force improves, and also peel resistance of the metal case 40 and the second sealing resin 52 improves.

(2) The second sealing resin 52 is formed by injecting a resin material into the space S between the metal case 40 and the power semiconductor module 30. Therefore, dents of the rough surface layer 46 or 46A of the metal case 40 can be sufficiently filled with the resin material.

(3) The rough surface layer 46 is formed of an aluminum oxide film. Therefore, chemical bonding force with the second sealing resin 52 becomes larger than that with aluminum, and adhesiveness further improves.

(4) An area of the insertion opening 17 of the metal case 40 is larger than a region opposing the heat dissipation units 41a and 41b of the metal case 40. Therefore, fluctuation in the height of the second sealing resin 52 due to a variation in an injection amount of a resin material can be reduced. As a result, the injection amount of the resin material can be easily controlled, and productivity improves.

(5) The metal cases 40A and 40B are formed by bonding the frame 41A and the fin plates 41B. Therefore, a material, by which the rough surface layer 46 or 46A is thickly formed, and a material suitable for die casting can be arbitrarily selected. As a result, productivity can improve by shortening a processing time of the rough surface layer 46 or 46A.

(6) In the case where the metal cases 40A and 40B are formed by bonding the frame 41A and the fin plates 41B, corrosion resistance of the joint 41e can improve by providing an oxide film on an outer surface thereof.

In the case where an oxide film is formed on a whole outer surface of the frame 41A and the fin plates 41B, and then the terminal for grounding 71 is formed, the oxide film can be removed in a short time by using a material, by which an oxide film is slowly formed, for a material for forming the terminal for grounding 71.

The present invention is not limited to the above embodiments, and can be applied to diverse variations without departing from the purpose of the present invention. For example, the above second embodiment has illustrated the structure in which the metal case 40A is configured with the frame 41A and a pair of the fin plates 41B. However, one of the fin plates 41B may be integrally molded with the frame 41A, and the other fin plate 41B formed as a different body may be joined to this molding.

Also, the above embodiments can be applied in combination. For example, in the second embodiment, the frame 41A and the fin plates 41B may be formed of different materials, as in the third embodiment. Also, in the first and second embodiments, the terminal for grounding 71 may be formed as in the third embodiment.

The above embodiments have illustrated a structure in which the oxide layer 46 or the irregular layer 46A is formed on a whole inner surface of the metal case 40. However, the oxide layer 46 or the irregular layer 46A may be formed just on an inner surface opposing upper surfaces 6j and 6k of the power semiconductor module 30 of the metal case 40.

On a peripheral side surface of the power semiconductor module, the peripheral side surface being formed by the first sealing resin, the second sealing resin has to be formed so as to fill dents of the rough surface layer formed on an inner surface of the metal case.

REFERENCE SIGNS LIST

6 First sealing resin
17 Insertion opening
17a Chamfer
17b Step
30 Power semiconductor module
31U, 31L Semiconductor device
32U, 32L Diode
33 to 36 Conductor plate
40, 40A, 40B Metal case
41A Frame
41B Fin plate
41a, 41b Heat dissipation unit
41d Opening
41e Joint
42 Heat dissipation fin
43 Flange
44 Thin wall portion
46 Oxide layer (rough surface layer)
46A Irregular layer (rough surface layer)
51 Insulating resin film
52 Second sealing resin
100, 100A, 100B Power module
S Space

The invention claimed is:

1. A power module, which is used in a power converter and mutually converts DC and AC, comprising:
   a power semiconductor module comprising a pair of conductor plates, a semiconductor device disposed between the conductor plates, and a first sealing resin covering side surfaces of the pair of conductor plates, the power semiconductor module being integrated by the first sealing resin;
   a metal case comprising a heat dissipation unit on an outer surface thereof and a storage unit storing the power semiconductor module; and
   a second sealing resin provided on an outer peripheral side of the first sealing resin of the power semiconductor module stored in the metal case, a side surface of the second sealing resin adhering to an inner surface of the metal case,
   wherein a rough surface layer for improving adhesiveness with the second sealing resin is provided at least on a region opposing the side surface of the second sealing resin on the inner surface of the metal case, and the second sealing resin fills dents of the rough surface layer,
   wherein an oxide layer is formed on an outer side surface of the metal case, and
   wherein the metal case comprises:
      a frame including an opening; and
      a heat dissipation fin plate formed of a material different from that of the frame and including a heat dissipation fin bonded to a periphery of the opening of the frame,
      the oxide layer is formed on outer side surfaces of the frame and the heat dissipation fin plate, and
      the thickness of the oxide layer formed on the outer side surface of the frame and the thickness of the oxide layer formed on the outer side surface of the heat dissipation fin plate are different.

2. The power module according to claim 1, wherein the second sealing resin is formed by injecting a fluid resin material.

3. The power module according to claim 2, wherein the rough surface layer is an oxide layer.

4. The power module according to claim 3, wherein at least a region including the rough surface layer is formed of aluminum-based metal, and the rough surface layer is formed of an anodized layer of aluminum-based metal.

5. The power module according to claim 1, wherein the rough surface layer is formed by a structure in which irregularities are formed on an inner side surface of the metal case.

6. The power module according to claim 1, wherein the metal case comprises:
   an oxide layer formed at least on an outer surface of a joint between the frame and the heat dissipation fin plate.

7. The power module according to claim 1, wherein
   the heat dissipation fin plate is formed of a material having a higher heat dissipation performance than that of the frame.

8. The power module according to claim 1, wherein the thickness of the rough surface layer is 0.5 to 30 μm.

9. The power module according to claim 1, wherein the oxide layer is an anodized layer.

10. The power module according to claim 1, wherein, in the oxide layer formed on the outer side surface of the frame and the oxide layer formed on the outer side surface of the heat dissipation fin plate, a part of the thinner oxide layer is removed and becomes a ground potential connection unit.

* * * * *